United States Patent
Shibaguchi

(10) Patent No.: US 11,031,408 B2
(45) Date of Patent: Jun. 8, 2021

(54) SEMICONDUCTOR DEVICE AND METHOD OF PRODUCING SEMICONDUCTOR DEVICE

(71) Applicant: LAPIS SEMICONDUCTOR CO., LTD., Kanagawa (JP)

(72) Inventor: Taku Shibaguchi, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/802,612

(22) Filed: Feb. 27, 2020

(65) Prior Publication Data
US 2020/0312860 A1    Oct. 1, 2020

(30) Foreign Application Priority Data
Mar. 29, 2019 (JP) ............................ JP2019-069319

(51) Int. Cl.
*G11C 11/34* (2006.01)
*H01L 27/11526* (2017.01)
(Continued)

(52) U.S. Cl.
CPC .... *H01L 27/11526* (2013.01); *G11C 16/0408* (2013.01); *G11C 16/10* (2013.01); *G11C 16/26* (2013.01); *H01L 27/11521* (2013.01); *H01L 29/0847* (2013.01); *H01L 29/42324* (2013.01); *H01L 29/66568* (2013.01);
(Continued)

(58) Field of Classification Search
CPC ....... G11C 16/0483; G11C 16/22; G11C 7/02; G11C 16/16; G11C 16/0433; G11C 16/10; G11C 16/14; G11C 16/24; G11C 16/26; G11C 16/04; G11C 16/08; G11C 11/24; G11C 11/404; G11C 11/4096; G11C 16/02; G11C 16/0408; H01L 27/0266; H01L 21/28035; H01L 21/28158; H01L 21/31116; H01L 21/3212; H01L 21/32137; H01L 21/823456; H01L 21/823462; H01L 21/823475; H01L 27/11526;
(Continued)

(56) References Cited

U.S. PATENT DOCUMENTS
2005/0087797 A1* 4/2005 Ishii .................... H01L 27/0688
257/315

FOREIGN PATENT DOCUMENTS
JP        2006196758 A    7/2006

\* cited by examiner

*Primary Examiner* — Thong Q Le
(74) *Attorney, Agent, or Firm* — Volentine, Whitt & Francos, PLLC

(57) ABSTRACT

A semiconductor device includes a semiconductor substrate, and a nonvolatile memory cell disposed on the semiconductor substrate. The nonvolatile memory cell includes a field-effect transistor for data writing, and a field-effect transistor for data readout that is adjacent to the field-effect transistor for data writing. Each of the field-effect transistor for data writing and the field-effect transistor for data readout includes a gate insulating film formed on the semiconductor substrate, a floating gate formed on the gate insulating film, and diffusion layers configuring a source region and a drain region on respective sides of the floating gate viewed in the thickness direction of the semiconductor substrate. The thickness of the gate insulating film of the field-effect transistor for data readout, and the thickness of the gate insulating film of the field-effect transistor for data writing, are different.

8 Claims, 13 Drawing Sheets

(51) Int. Cl.
  *G11C 16/26*       (2006.01)
  *H01L 27/11521*    (2017.01)
  *H01L 29/08*       (2006.01)
  *H01L 29/423*      (2006.01)
  *G11C 16/04*       (2006.01)
  *H01L 29/66*       (2006.01)
  *G11C 16/10*       (2006.01)
  *H01L 21/28*       (2006.01)
  *H01L 21/02*       (2006.01)
  *H01L 21/311*      (2006.01)
  *H01L 21/762*      (2006.01)
  *H01L 21/3105*     (2006.01)
  *H01L 21/265*      (2006.01)

(52) U.S. Cl.
  CPC .... *H01L 29/66825* (2013.01); *H01L 21/0217* (2013.01); *H01L 21/02164* (2013.01); *H01L 21/02238* (2013.01); *H01L 21/02255* (2013.01); *H01L 21/02271* (2013.01); *H01L 21/02274* (2013.01); *H01L 21/26513* (2013.01); *H01L 21/31053* (2013.01); *H01L 21/31111* (2013.01); *H01L 21/31144* (2013.01); *H01L 21/76224* (2013.01); *H01L 29/40114* (2019.08)

(58) Field of Classification Search
  CPC ........... H01L 27/11573; H01L 27/1266; H01L 29/0649; H01L 27/1052
  USPC ............................... 365/149, 63, 72, 185.12
  See application file for complete search history.

SEMICONDUCTOR DEVICE AND METHOD OF PRODUCING SEMICONDUCTOR DEVICE

CROSS-REFERENCE TO RELATED APPLICATION

This application is based on and claims priority under 35 USC 119 from Japanese patent Application No. 2019-069319, filed Mar. 29, 2019, the disclosure of which is incorporated by reference herein.

BACKGROUND

Technical Field

The present disclosure relates to a semiconductor device and a method of producing a semiconductor device.

Related Art

Multi-time programmable (MTP) nonvolatile memories as opposed to one-time programmable (OTP) nonvolatile memories are known.

Examples of applications of MTP nonvolatile memory cells include nonvolatile memory circuit units for storing a relatively small volume of information such as a manufacturer's serial number of an Si semiconductor product, and recently introduced nonvolatile memory circuit units replacing an RF (Radio Frequency) tag used for apparel or other merchandise distribution.

For example, Japanese Patent Application Laid-Open (JP-A) No. 2006-196758 discloses a nonvolatile memory in which plural nonvolatile memory cells are arranged in an array, and in which a field-effect transistor for selecting a memory cell is electrically connected for each bit. This nonvolatile memory cell has a field-effect transistor for data writing, a field-effect transistor for data readout, and a capacitance unit, wherein the gate electrode of the field-effect transistor for data writing, and the gate electrode of the field-effect transistor for data readout are configured as parts of the same floating gate electrode.

SUMMARY OF THE INVENTION

The present disclosure addresses provision of a semiconductor device provided with a nonvolatile memory that includes a field-effect transistor for data writing and a field-effect transistor for data readout, and that is capable of exhibiting characteristics suitable for each of the field-effect transistors. The present disclosure also addresses provision of a method of producing the semiconductor device.

A semiconductor device according to the present disclosure includes:

a semiconductor substrate, and a nonvolatile memory cell placed on the semiconductor substrate;

wherein the nonvolatile memory cell includes a field-effect transistor for data writing, and a field-effect transistor for data readout that is adjacent to the field-effect transistor for data writing;

each of the field-effect transistor for data writing and the field-effect transistor for data readout includes a gate insulating film formed on the semiconductor substrate, a floating gate formed on the gate insulating film, and diffusion layers configuring a source region and a drain region on respective sides of the floating gate viewed in the thickness direction of the semiconductor substrate; and the thickness of the gate insulating film of the field-effect transistor for data readout, and the thickness of the gate insulating film of the field-effect transistor for data writing are different.

A method of producing a semiconductor device according to this exemplary embodiment is a method of producing a semiconductor device provided with a nonvolatile memory cell including a field-effect transistor for data writing and a field-effect transistor for data readout that is adjacent to the field-effect transistor for data writing, the method including:

forming a first insulating film for configuring a part, in a thickness direction, of a gate insulating film of one of the field-effect transistor for data readout or the field-effect transistor for data writing, in a region of a semiconductor substrate in which the field-effect transistor for data writing and the field-effect transistor for data readout are to be formed;

removing a part of the first insulating film corresponding to a region in which the other one of the field-effect transistor for data readout or the field-effect transistor for data writing is to be formed;

forming a second insulating film configuring the gate insulating film together with the first insulating film in the one of the field-effect transistor for data readout or the field-effect transistor for data writing, and also configuring a gate insulating film in the other of the field-effect transistor for data readout or the field-effect transistor for data writing, in the region in which the field-effect transistor for data writing and the field-effect transistor for data readout are to be formed;

forming a floating gate on each of the gate insulating film for the field-effect transistor for data writing and the gate insulating film for the field-effect transistor for data readout; and forming diffusion layers configuring a source region and a drain region on respective sides of the floating gate of the field-effect transistor for data writing, and diffusion layers configuring a source region and a drain region on respective sides of the floating gate of the field-effect transistor for data readout, viewed in the thickness direction of the semiconductor substrate.

The present disclosure provides a semiconductor device provided with a nonvolatile memory that includes a field-effect transistor for data writing and a field-effect transistor for data readout, and that is capable of exhibiting characteristics suitable for each of the field-effect transistors. The present disclosure also provides a method of producing the semiconductor device.

DETAILED DESCRIPTION OF THE INVENTION

Figure 1:
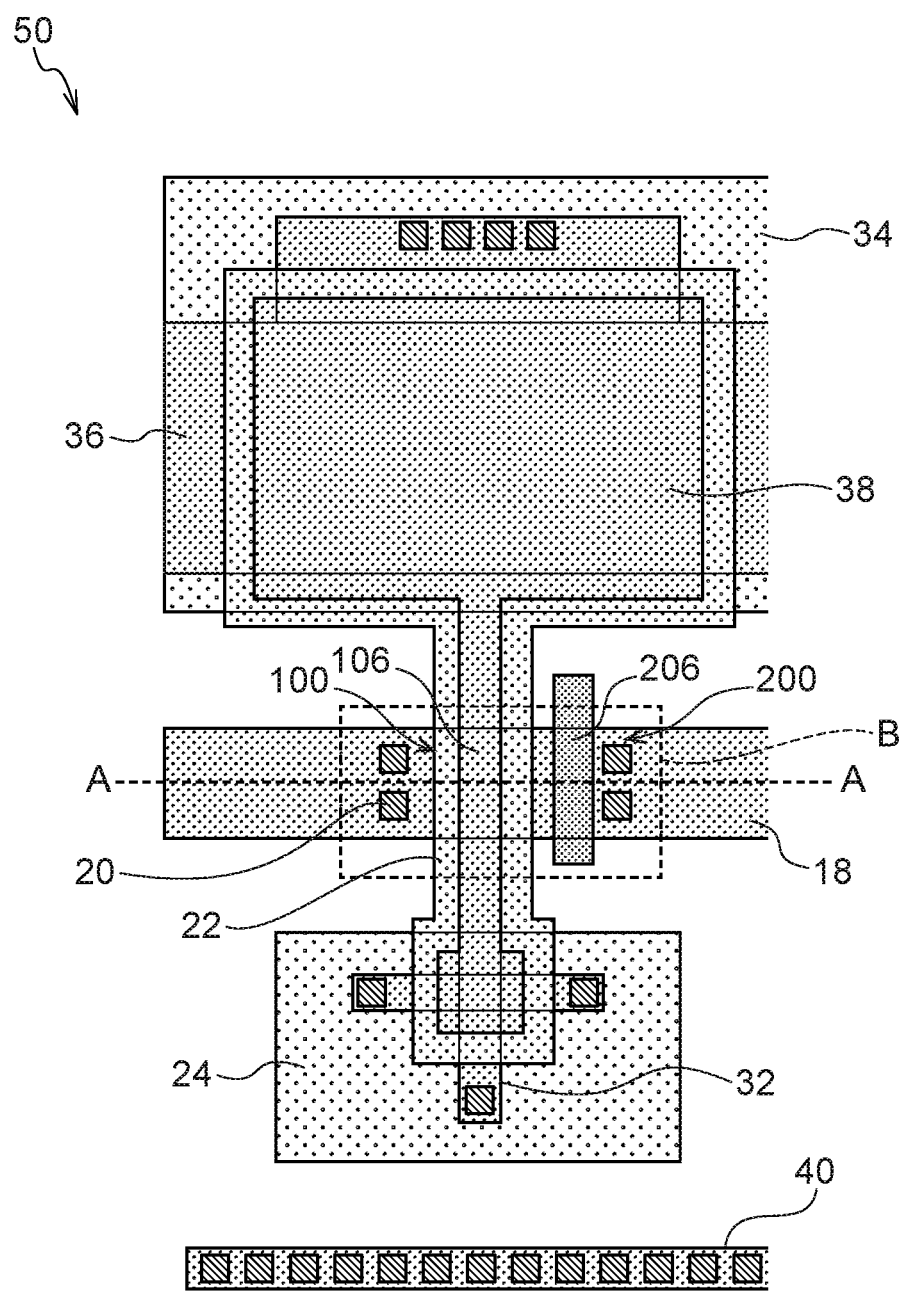
FIG. 1 is a schematic diagram illustrating an example of a nonvolatile memory cell of a semiconductor device according to an exemplary embodiment of the present disclosure.

An exemplary embodiment of the present disclosure will be described referring to the drawings. In the drawings, substantially the same or equivalent elements or parts are denoted by a same reference sign. In addition, the term "step" includes herein not only an independent step, but also a step which is not clearly distinguished from other step insofar as an intended function of the step can be attained.

A data retention characteristic, namely a time required for a stored data to be lost due to a time-dependent change of the charge of a floating gate, is one characteristic for evaluating the performance of a nonvolatile memory cell.

In a field-effect transistor for data writing and a field-effect transistor for data readout in a conventional MTP nonvolatile memory cell, the gate oxide film of a field-effect transistor for data writing is ordinarily formed by thermal oxidation to have a thickness of from 4 nm to 10 nm in consideration of data retention characteristics.

When such a nonvolatile memory cell provided with a field-effect transistor for data writing and a field-effect transistor for data readout is produced by conventional methods, the field-effect transistor for data readout adjacent to the field-effect transistor for data writing is formed in the same process as the process for forming the field-effect transistor for data writing, and the gate oxide film for the field-effect transistor for data readout will have the same thickness as the gate oxide film of the field-effect transistor for data writing.

When the thickness of the gate oxide film for the field-effect transistor for data readout is also from 4 nm to 10 nm, the gate voltage of about 2 to 3 V is required to reliably switch ON the channel of the field-effect transistor for data readout. However, the maximum voltage for a nonvolatile memory cell used as replacement for a RF tag for apparel or merchandise distribution is from about 1.0 V to about 1.5 V, at which a sufficient driving current in an ON state of the memory cell cannot be obtained.

Under such circumstances, the present inventor has carried out careful investigations. As a result, the present inventor has found that, in a nonvolatile memory cell provided with a field-effect transistor for data writing and a field-effect transistor for data readout, threshold voltages suitable for the respective transistors can be attained by setting the thickness of the gate insulating film to a thickness suitable for the function and environment required for each transistor. The present inventor has invented the nonvolatile memory cell according to the present disclosure and the method of producing the nonvolatile memory cell based on the above finding.

A semiconductor device according to an exemplary embodiment includes a semiconductor substrate and a nonvolatile memory cell disposed on the semiconductor substrate, and the nonvolatile memory cell includes a field-effect transistor for data writing, and a field-effect transistor for data readout that is adjacent to the field-effect transistor for data writing. Each of the field-effect transistor for data writing and the field-effect transistor for data readout includes a gate insulating film formed on the semiconductor substrate, a floating gate formed on the gate insulating film, and diffusion layers configuring a source region and a drain region on respective sides of the floating gate viewed in the thickness direction of the semiconductor substrate. The thickness of the gate insulating film of the field-effect transistor for data readout and the thickness of the gate insulating film of the field-effect transistor for data writing are different.

FIG. 1 is a schematic view illustrating an example of a nonvolatile memory cell of a semiconductor device according to an exemplary embodiment of the present disclosure. A nonvolatile memory cell 50 illustrated in FIG. 1 includes a field-effect transistor 100 for data writing, and a field-effect transistor 200 for data readout that is adjacent to the field-effect transistor 100 for data writing. Further, in the nonvolatile memory cell illustrated in FIG. 1, reference numeral 18 denotes an active region (transistor for readout), reference numeral 20 denotes a contact, reference numeral 22 denotes a sidewall, reference numerals 24 and 34 denote n-type well regions, reference numeral 32 and 36 denote active regions (transistor units for data writing), reference numeral 38 denotes a floating gate, and reference numeral 40 denotes an active region (substrate potential).

Figure 2:
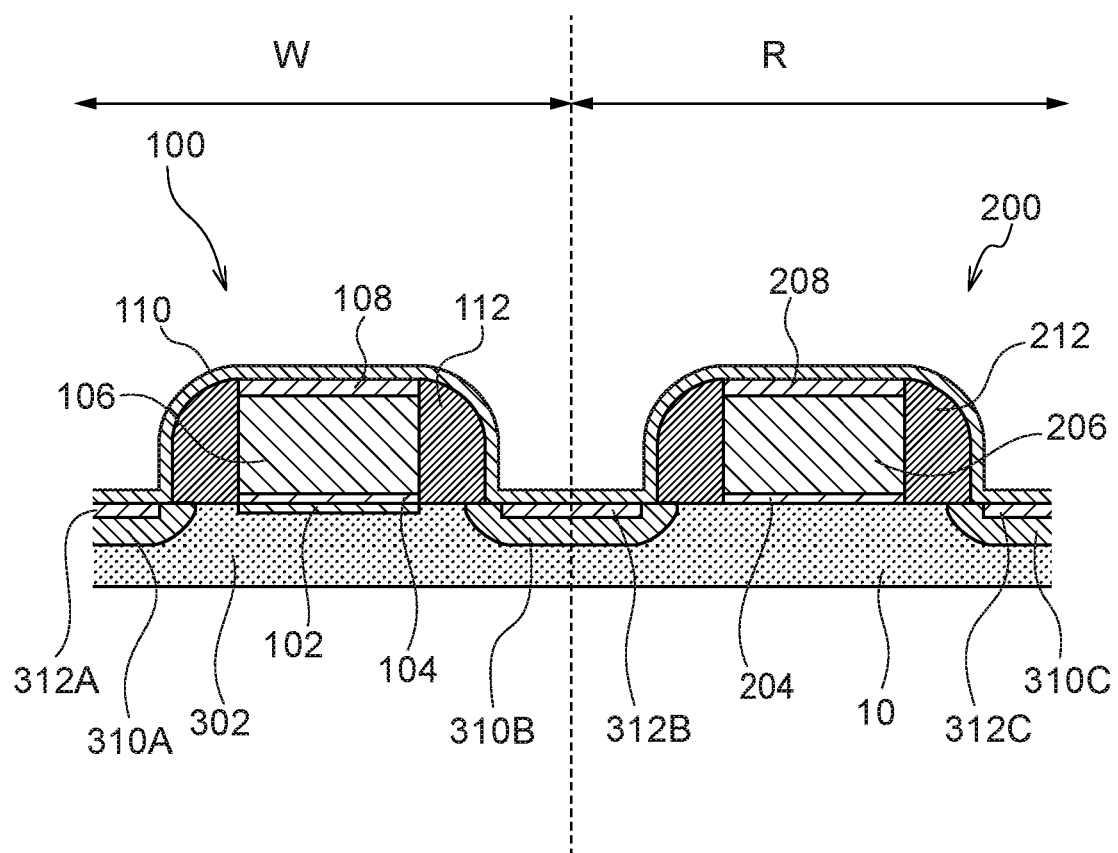
FIG. 2 is a schematic diagram illustrating a cross-sectional view of an example of a field-effect transistor for data writing and a field-effect transistor for data readout taken along line A-A in FIG. 1.

FIG. 2 schematically illustrates the field-effect transistor 100 for data writing, and the field-effect transistor 200 for data readout accompanying the field-effect transistor 100 for data writing, included in the region enclosed by dotted line B in the cross section taken along line A-A in FIG. 1.

The field-effect transistor 100 for data writing includes gate insulating films 102 and 104 formed from $SiO_2$ or the like and provided on a p-well 302 positioned in a surface layer of the silicon substrate, and a floating gate 106 formed on a combined gate insulating film composed of gate insulating films 102 and 104. Further, the field-effect transistor 100 includes n-type diffusion layers 310A and 310B configuring a source and a drain at positions on the surface layer of the p-well 302 that flank the floating gate 106 (i.e., positioned at respective sides of the floating gate 106 so as to be located on the surface layer of the p-well 302). The lateral faces of the floating gate 106 are covered by sidewalls 112 formed from an insulator such as $SiO_2$. Alloy layers 108, 312A, and 312B formed from a compound of silicon and a metal, such as cobalt silicide, is are provided on a surface of the floating gate 106, a surface of the n-type diffusion layer 310A, and a surface of the n-type diffusion layer 310B, respectively.

On the other hand, the field-effect transistor 200 for data readout is formed on the silicon substrate 10 so as to be located in the vicinity of the field-effect transistor 100 for data writing. The field-effect transistor 200 for data readout includes a gate insulating film 204 formed from $SiO_2$ or the like provided on a surface of the p-well 302, a floating gate 206 formed from polysilicon provided on the gate insulating film 204, and n-type diffusion layers 310B and 310C configuring a source and a drain at positions on the surface layer of the p-well 302 that flank the floating gate 206 (i.e., positioned at respective sides of the floating gate 206 so as to be located on the surface layer of the p-well 302). The n-type diffusion layer 312B is shared by the field-effect transistor 200 for date readout and the field-effect transistor 100 for data writing.

The thickness of the gate insulating film 204 of the field-effect transistor 200 for data readout is smaller than the total thickness of the gate insulating films 102 and 104 of the field-effect transistor 100 for data writing. As illustrated in this configuration, the present disclosure contemplates a structure in which one of the source region or the drain region of one of the field-effect transistor for data writing or the field-effect transistor for data readout is shared with the other one of the field-effect transistor for data writing or the field-effect transistor for data readout (i.e., also works as a source or drain region of the other one of the field-effect transistor for data writing or the field-effect transistor for data readout).

Further, the floating gate 206 of the field-effect transistor 200 for data readout is electrically isolated from the floating gate 106 of the field-effect transistor 100 for data writing. The lateral faces of the floating gate 206 are covered by sidewalls 212 formed from an insulator such as $SiO_2$. Alloy layers 208, 312B and 312C formed from a compound of silicon and a metal, such as cobalt silicide, are provided on a surface of the floating gate 206 a surface of the n-type diffusion layer 310B, and a surface of the n-type diffusion layer 310C, respectively.

The entire periphery of the field-effect transistor 100 for data writing and the field-effect transistor 200 for data readout is covered with a silicon nitride film 110 mainly formed from $Si_3N_4$ and having a thickness of from about 20 nm to about 40 nm.

A main structure of a nonvolatile memory cell of a semiconductor device according to an exemplary embodiment will specifically be described while illustrating an example of a method of producing a semiconductor device according to the present disclosure.

Although there is no particular restriction on the method used for producing a semiconductor device according to the present disclosure, the semiconductor device can be suitably produced by a method including:

forming a first insulating film for configuring a part, in the thickness direction, of a gate insulating film of one of the field-effect transistor for data readout or the field-effect transistor for data writing, in a region of a semiconductor substrate in which the field-effect transistor for data writing and the field-effect transistor for data readout are to be formed;

removing a part of the first insulating film corresponding to a region in which the other one of the field-effect transistor for data readout or the field-effect transistor for data writing is to be formed;

forming a second insulating film configuring the gate insulating film together with the first insulating film in the one of the field-effect transistor for data readout or the field-effect transistor for data writing, and also configuring a gate insulating film in the other of the field-effect transistor for data readout or the field-effect transistor for data writing, in the region in which the field-effect transistor for data writing and the field-effect transistor for data readout are to be formed;

forming a floating gate on each of the gate insulating film for the field-effect transistor for data writing and the gate insulating film for the field-effect transistor for data readout; and forming diffusion layers configuring a source region and a drain region on respective sides of the floating gate of the field-effect transistor for data writing, and diffusion layers configuring a source region and a drain region on respective sides of the floating gate of the field-effect transistor for data readout, viewed in the thickness direction of the semiconductor substrate.

FIG. 3 to FIG. 13 illustrate an example of a process of forming a field-effect transistor for data writing and a field-effect transistor for data readout in a nonvolatile memory cell for a semiconductor device. Although the semiconductor substrate to be used according to the present disclosure may be p-type or n-type, a p-type semiconductor substrate is preferable from the viewpoint of ease of production. In the following explanation, a case where a p-type silicon substrate is used will be described.

(Formation of Trench)

On one side of the silicon substrate 10, a silicone oxide film ($SiO_2$) 12 is formed by thermal oxidation, and then a silicon nitride film ($Si_3N_4$) 14 is formed by CVD.

Next, the silicone oxide film 12 and the silicon nitride film 14 are removed, by photolithography and etching, from regions outside a region at which a field-effect transistor 100 for data writing and a field-effect transistor 200 for data readout are to be formed on the silicon nitride film 14 (hereinafter also referred to as "transistor formation region").

Figure 3:
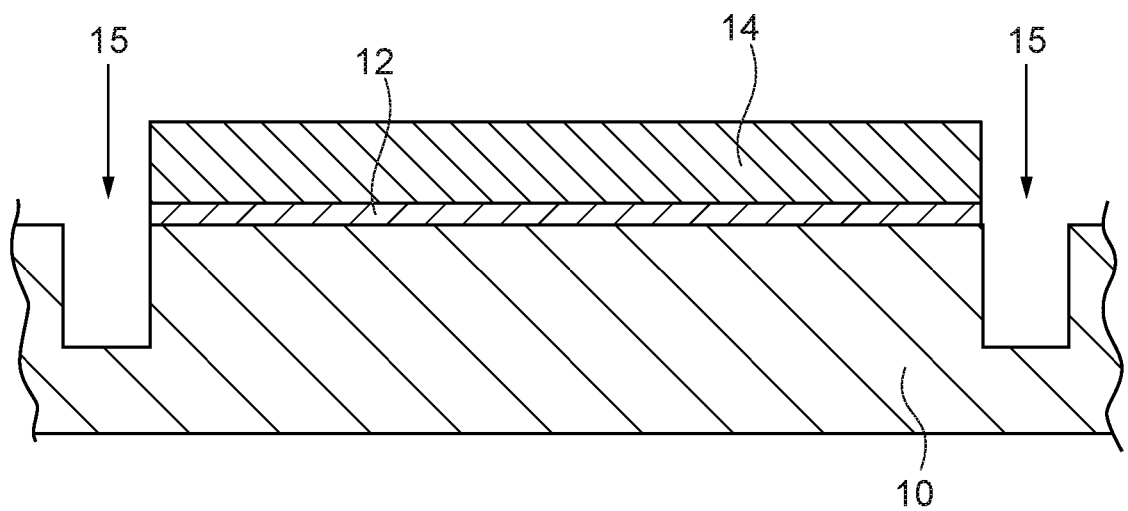
FIGS. 3 to 13 are schematic cross-sectional views illustrating an example of a method of producing a semiconductor device according to an exemplary embodiment of the present disclosure.

Next, etching is performed using the silicone oxide film 12 and the silicon nitride film 14 as a mask, thereby forming trenches 15 at parts of the silicon substrate 10 (FIG. 3).

(Formation of Device Isolation Film)

Next, a silicone oxide film (embedded oxide film) to be embedded in the trenches 15 is formed by HDPCVD (High Density Plasma Chemical Vapor Deposition).

Next, the surface is planarized by CMP (Chemical Mechanical Polishing), and the silicone oxide film 12 and the silicon nitride film 14 formed as a mask for forming the trenches are removed, for example, by dry etching. In this way, a device isolation film 308, which is a silicone oxide film embedded in each trench 15 formed in the silicon substrate 10, is formed.

Figure 4:
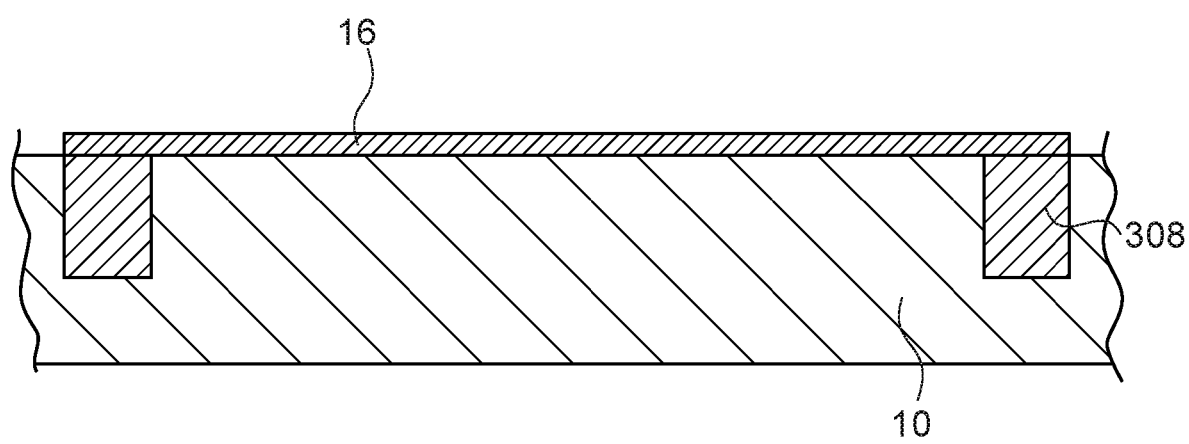

Further, a silicone oxide film (pre-oxide film) 16 is formed on the silicon substrate 10 and the device isolation film 308 by performing pre-oxidation (FIG. 4).

(Formation of Well)

Figure 5:
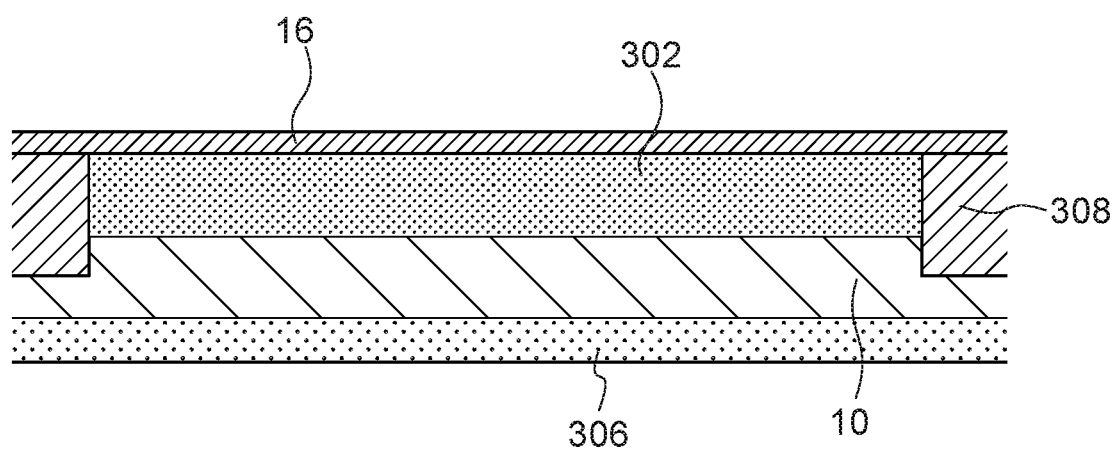

Next, boron, for example, is implanted into the silicon substrate 10 up to a predetermined depth by an ion implantation method, thereby forming a p-well 306 having p-type conductivity. Further, arsenic or phosphorus is implanted into the surface layer of the silicon substrate 10, whereby a p-well 302 for adjusting Vt (threshold) having p-type conductivity is formed (FIG. 5).

(Formation of First Gate Insulating Film)

Figure 6:
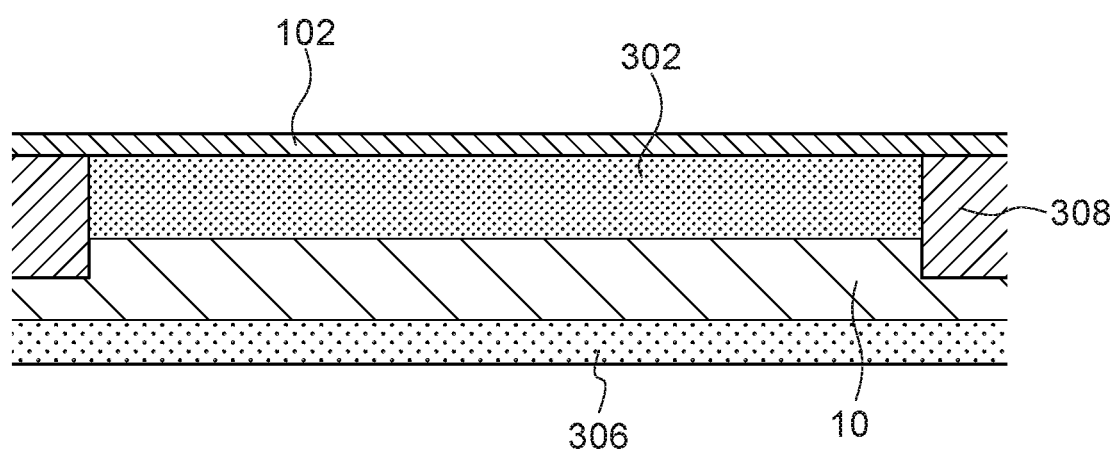

Next, after removing the pre-oxide film 16, the first gate insulating film (first insulating film) 102 is formed in the transistor formation region (FIG. 6).

As the first gate insulating film, an oxide film or an oxynitride film is preferable. In this exemplary embodiment, a silicone oxide film 102 that integrally covers the surface of the p-well 302 and the device isolation film 308 is formed as the first gate insulating film 102, using, for example, CVD or thermal oxidation.

In the present exemplary embodiment, the first gate insulating film 102 and a second gate insulating film 104 described below are stacked, in the region W at which a field-effect transistor 100 for data writing is to be formed, so as to configure a gate insulating film of the field-effect transistor 100 for data writing. On the other hand, in the region R at which a field-effect transistor 200 for data readout is to be formed, the first gate insulating film 102 is removed, and the second gate insulating film 104 configures a gate insulating film for the region R at which the field-effect transistor 200 for data readout is to be formed.

The total thickness of the gate insulating films 102 and 104 of the field-effect transistor 100 for data writing in the present exemplary embodiment is preferably from 4 nm to 10 nm from the viewpoint of satisfactory retention characteristics. The thickness of the gate insulating film 204 of the field-effect transistor 200 for data readout is preferably from 2 nm to 4 nm from the viewpoint of lowering the voltage. The first gate insulating film 102 is preferably formed to have a thickness that is equal to the difference determined by subtracting the thickness of the second gate insulating film 104 or 204 from the thickness of a gate insulating film required for the field-effect transistor 100 for data writing. Since the total thickness of the gate insulating films 102 and 104 for the field-effect transistor 100 for data writing is preferably twice or more larger than the thickness of the gate insulating film 204 for the field-effect transistor 200 for data readout, the first gate insulating film 102 is preferably formed so as to have a thickness larger than that of the second gate insulating film 104 or 204. More specifically, the thickness of the first gate insulating film 102 is preferably a thickness of from 2 to 6 nm.

(Partial Removal of First Gate Insulating Film)

Figure 7:
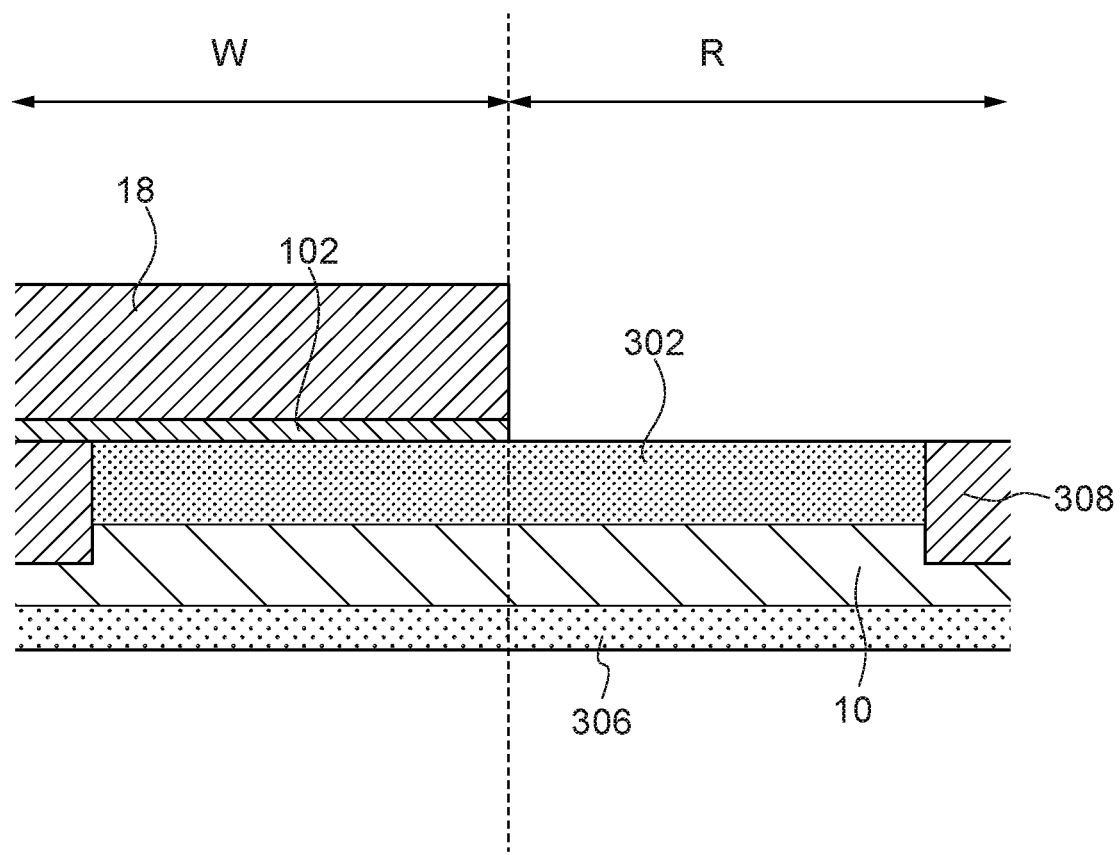

Within the region at which the first gate insulating film 102 has been formed, the first gate insulating film 102 is removed from one of the region W at which the field-effect transistor 100 for data writing is to be formed or the region R at which the field-effect transistor 200 for data readout is to be formed. According to the present exemplary embodiment, the first gate insulating film 102 in the region R, at which the field-effect transistor 200 for data readout is to be formed, is removed. More specifically, only a part of the first gate insulating film 102 that is in the region at which the field-effect transistor for data writing is to be formed is covered with a resist mask 18 by photolithography. Then, the other part of the first gate insulating film 102 that is not covered with the resist mask 18, in the region R at which the field-effect transistor for data readout is to be formed, is removed by dry etching or wet etching (FIG. 7).

(Formation of Second Gate Insulating Film)

Figure 8:
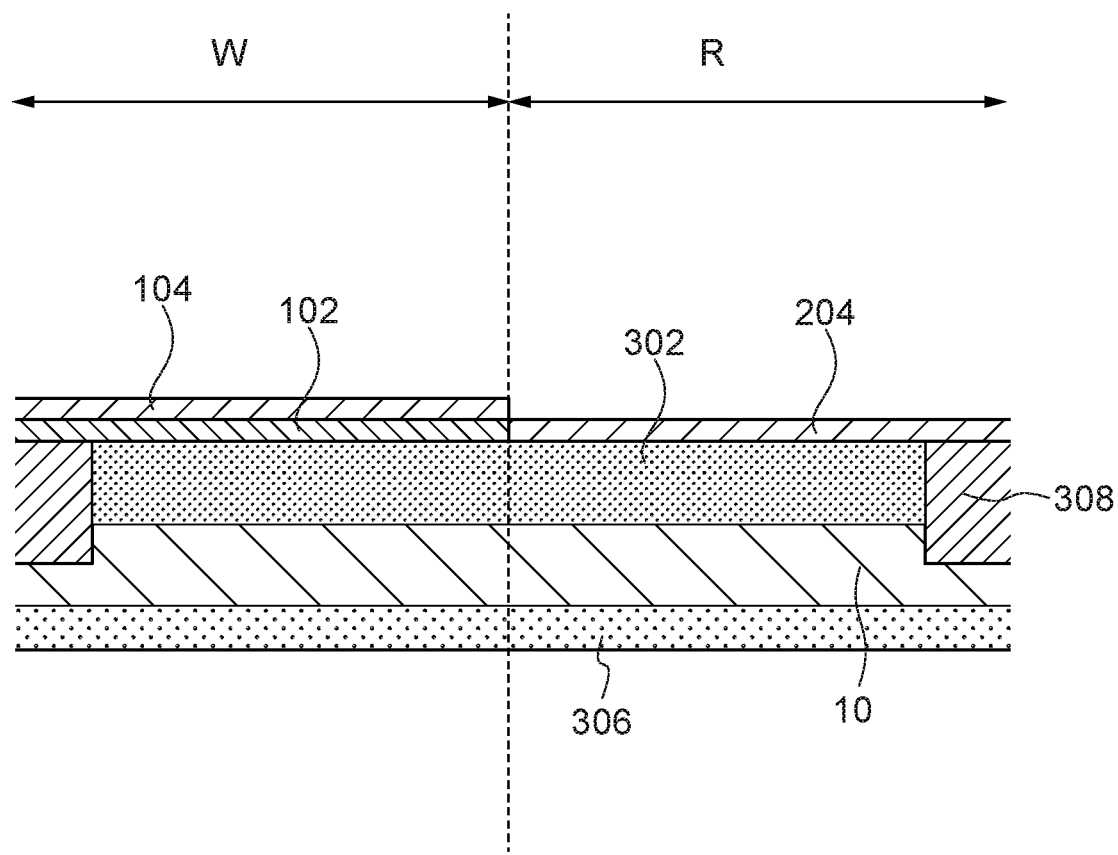

Next, the resist mask 18 is removed, and a second gate insulating films (second insulating films) 104 and 204 are formed in the region W at which the field-effect transistor 100 for data writing is to be formed, and the region R at which the field-effect transistor 200 for data readout is to be formed, respectively (FIG. 8). Since the second gate insulating films 104 and 204 are formed in the same process, the second gate insulating films 104 and 204 have substantially the same thickness.

As described above, in the present exemplary embodiment, the first gate insulating film 102 and the second gate insulating film 104 together configure an integrated gate insulating film for the field-effect transistor 100 for data writing in the region W at which the field-effect transistor 100 for data writing is to be formed, and the second gate insulating film 204 configures a gate insulating film for the field-effect transistor 200 for data readout in the region R at which the field-effect transistor 200 for data readout is to be formed.

When the first gate insulating film 102 is formed to have a thickness of from 2 nm to 6 nm, it is preferable to form the second gate insulating film 204 in a thickness of from 2 nm to 4 nm from the viewpoints of the retention characteristics of the field-effect transistor 100 for data writing and lowering the voltage of the field-effect transistor 200 for data readout. In this manner, the gate insulating film of the field-effect transistor 100 for data writing will have a thickness of from 4 nm to 10 nm as a result of stacking of the first gate insulating film 102 and the second gate insulating film 104, while the gate insulating film of the field-effect transistor 200 for data readout has a thickness of from 2 nm to 4 nm, which is the thickness of the second gate insulating film 204.

The second gate insulating film 104/204 is preferably an oxide film or an oxynitride film, similar to the case of the first gate insulating film 102, and the second gate insulating film may be formed, for example, by CVD or thermal oxidation. In this regard, a configuration may be adopted in which, for example, an oxide film is formed as the first gate insulating film 102, and in which an oxynitride film having a dielectric constant higher than that of the oxide is formed as the second gate insulating film.

(Formation of Floating Gate)

Next, floating gates 106 and 206 are formed on the second gate insulating films 104 and 204, respectively, in the region W at which the field-effect transistor 100 for data writing is to be formed, and the region R at which the field-effect transistor 200 for data readout is to be formed.

For example, a polysilicon film is formed by CVD on the surfaces of the second gate insulating films 104 and 204. Subsequently, phosphorus or arsenic is implanted in the entire surface of the polysilicon film by ion implantation. In this manner, n-type conductivity is imparted to the entire polysilicon film.

Figure 9:
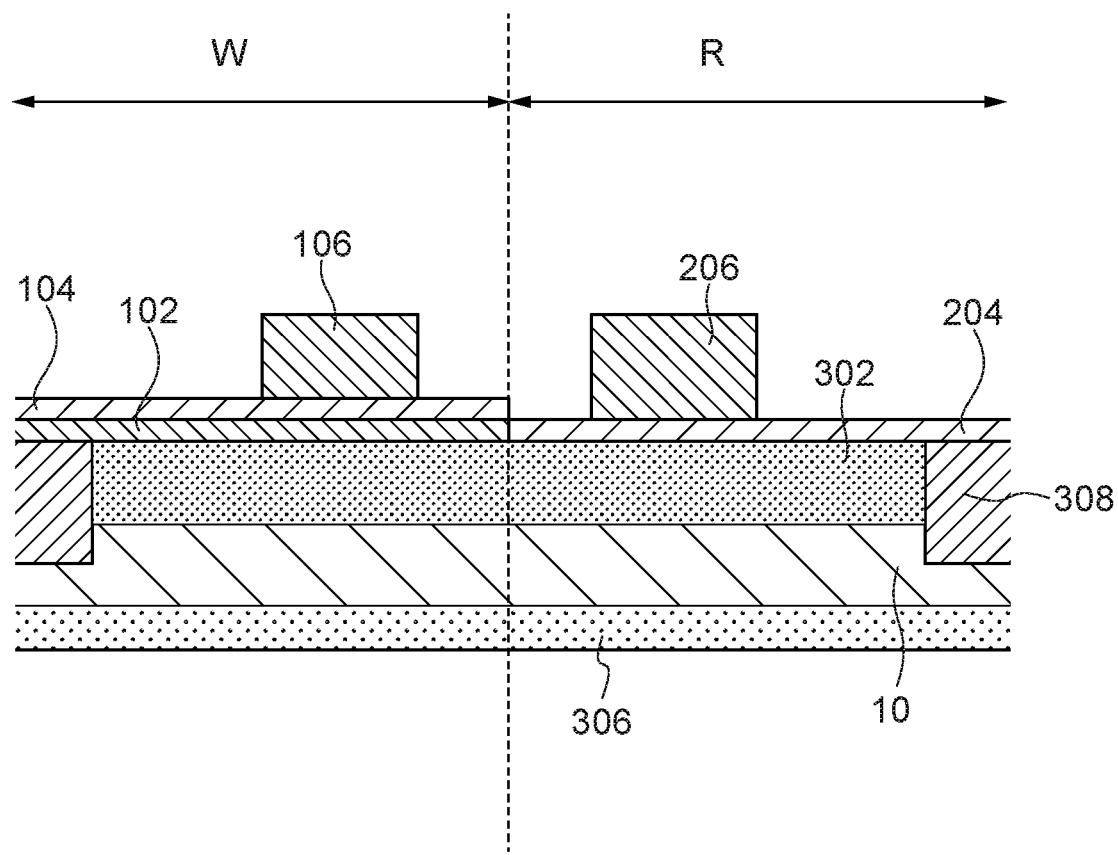

Next, the polysilicon film is patterned using photolithography and etching. As a result, a floating gate 106 of the field-effect transistor 100 for data writing, and a floating gate 206 of the field-effect transistor 200 for data readout are formed (FIG. 9).

(Formation of Sidewalls)

Next, a SiN film is formed by CVD to cover the upper surface and lateral surfaces of each of the floating gate 106 of the field-effect transistor 100 for data writing and the floating gate 206 of the field-effect transistor 200 for data readout, and then an insulating film such as SiO$_2$ is formed over the silicon substrate 10.

Figure 10:
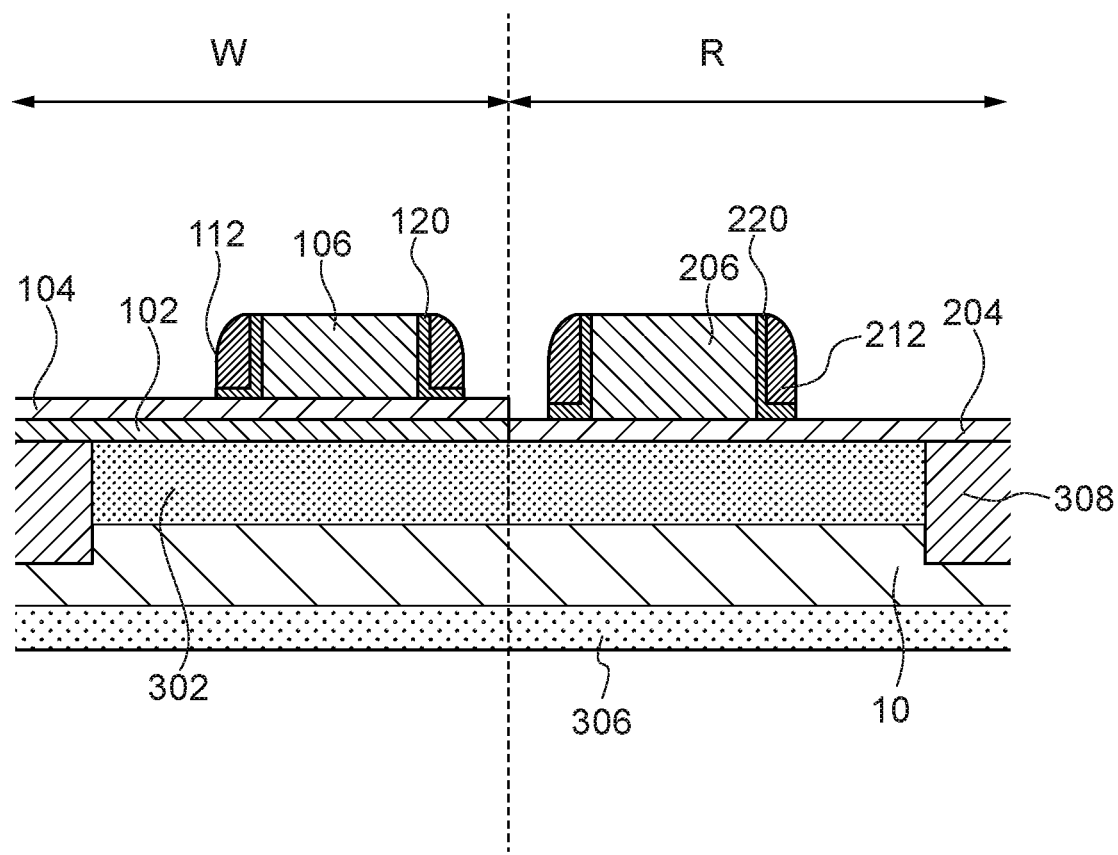

Subsequently, the insulating films are etched back. In this manner, a SiN film 120 and a sidewall 112 covering the lateral faces of the floating gate 106 of the field-effect transistor 100 for data writing, and a SiN film 220 and a sidewall 212 covering the lateral faces of the floating gate 206 of the field-effect transistor 200 for data readout, are formed (FIG. 10).

(Formation of Diffusion Layer)

Next, diffusion layers 310A, 301B and 310C, each configuring a source region or a drain region, are formed such that: in each of the region W at which the field-effect transistor 100 for data writing is to be formed and the region R at which the field-effect transistor 200 for data readout is to be formed, a source region and a drain region are provided at respective sides of the floating gate 106 or 206 in the silicon substrate 10 (i.e., a source region and a drain region are provided in the silicon substrate 10 such that the floating gate 106 or 206 is flanked by the source region and the drain region), viewed in the thickness direction of the silicon substrate 10.

Figure 11:
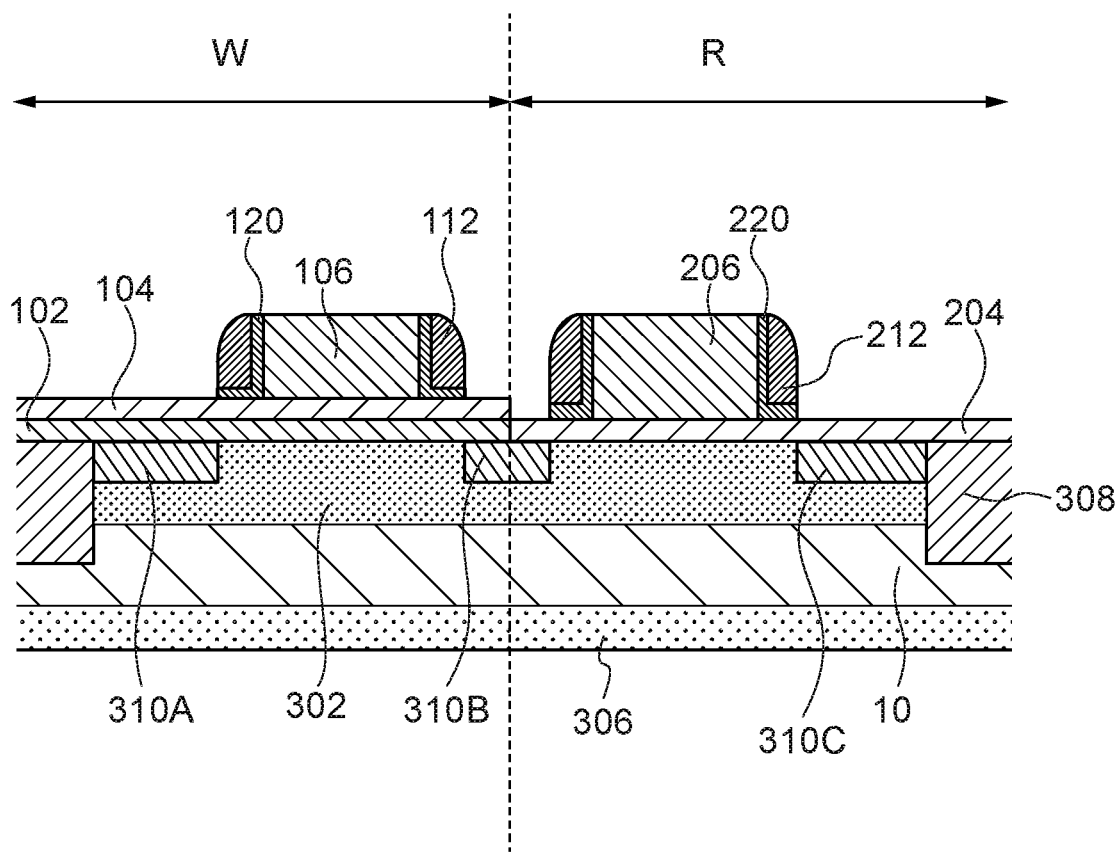

For example, arsenic or phosphorus is implanted by ion implantation into the surface of a p-well 302 in the silicon substrate 10 at positions at both sides of the floating gate 106 or 206 viewed in the thickness direction of the silicon substrate 10, in each of the region W at which the field-effect transistor 100 for data writing is to be formed and the region R at which the field-effect transistor 200 for data readout is to be formed. In this manner, n-type diffusion layers 310A, 310B, and 310C, each configuring a source or drain, are respectively formed in the surface layer of the p-well 302 such that each of the floating gate 106 and the floating gate 206 is flanked by a source and a drain (FIG. 11).

(Removal of Oxide Film/Formation of Co Silicide Layer)

Figure 12:
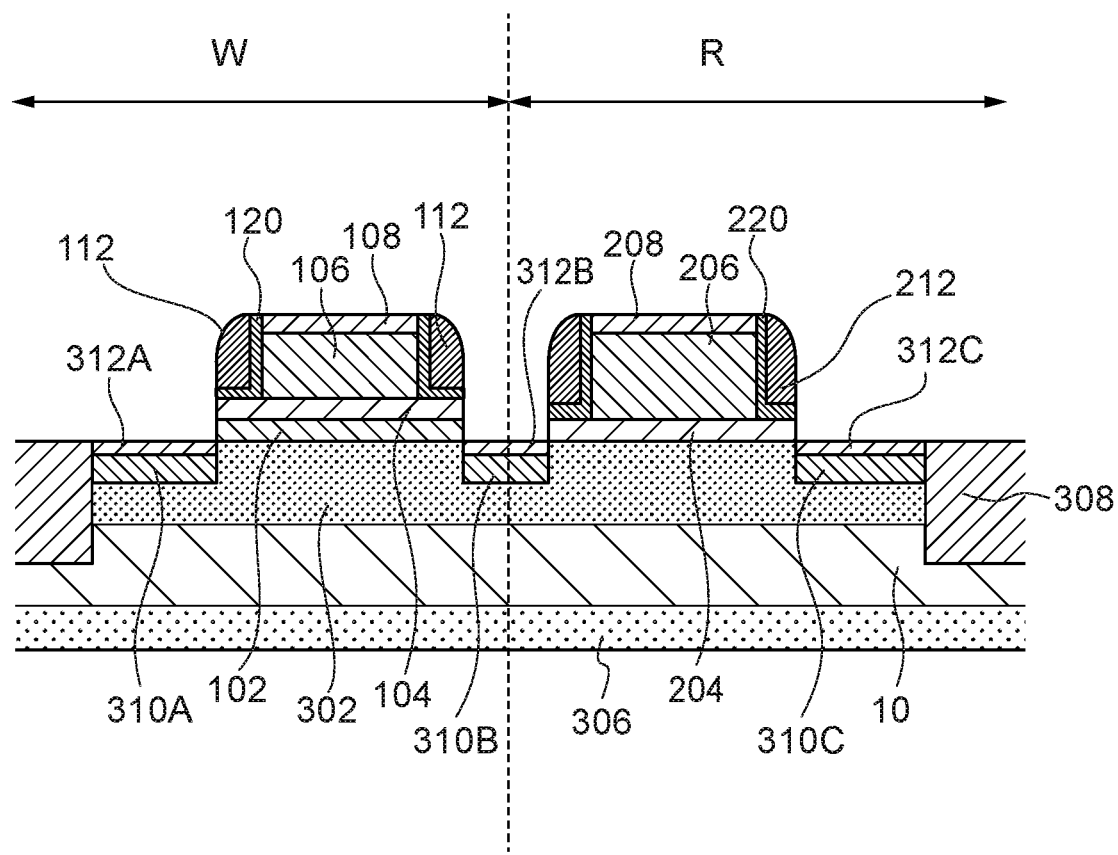

Next, oxide films (gate insulating films 102, 104, and 204) exposed in the region W at which the field-effect transistor 100 for data writing is to be formed and the region R at which the field-effect transistor 200 for data readout is to be formed are removed, and then alloy layers 312A, 312B, 312C, 108, and 208 are formed using a salicide process on the surfaces of the n-type diffusion layers 310A, 310B, and 310C and the surfaces of the floating gates 106 and 206 in the field-effect transistor 100 for data writing and the field-effect transistor 200 for data readout (FIG. 12).

For example, a cobalt film is formed, by sputtering, on the substrate 10 so as to cover the entire surface of the field-effect transistor 100 for data writing and the field-effect transistor 200 for data readout.

Subsequently, a Co silicide layer mainly containing cobalt monosilicide (CoSi) is formed by heat treatment at portions at which silicon and the cobalt film are in contact with each other, namely on the surfaces of the n-type diffusion layers 310A, 310B, and 310C and the surfaces of the floating gates 106 and 206.

Subsequently, the cobalt film in the region (device isolation region) outside the field-effect transistor 100 for data writing and the field-effect transistor 200 for data readout is removed by a chemical treatment.

Subsequently, cobalt monosilicide (CoSi) is phase-changed into cobalt disilicide ($CoSi_2$) by an additional heat treatment.

As a result, alloy layers 312A, 312B, 312C, 108, and 208 mainly containing cobalt disilicide ($CoSi_2$) are formed on the respective surfaces of the n-type diffusion layers 310A, 310B, and 310C, and the floating gates 106 and 206. In this regard, each heat treatment is performed by RTA (Rapid Thermal Anneal), which involves a short heating time.

(Formation of Interlayer Insulating Film/Formation of Contact)

Thereafter, a silicon nitride film 110 is provided on the entire surface of the field-effect transistor 100 for data writing and the field-effect transistor 200 for data readout, and then an interlayer insulating film (intermediate layer) 320 covering the field-effect transistor 100 for data writing and the field-effect transistor 200 for data readout is formed.

Further, contacts 322, each connected with the field-effect transistor 100 for data writing or the field-effect transistor 200 for data readout, are formed in the interlayer insulating film 320. A final nonvolatile memory cell is obtained by further carrying out steps such as forming a wiring on the interlayer insulating film 320 that is connected to the field-effect transistor 100 for data writing or the field-effect transistor 200 for data readout via the contact 322 (FIG. 13).

The above-described process makes it possible to, for example, form the gate insulating films 102 and 104 of the field-effect transistor 100 for data writing to have a total thickness of from 4 nm to 10 nm, at which satisfactory retention characteristics can be attained, while allowing the gate insulating film 204 of the field-effect transistor 200 for data readout to have a small thickness of from 2 nm to 4 nm. Forming of a nonvolatile memory cell having such a structure enables the gate voltage of a field-effect transistor for data readout to be a low voltage without impairing the retention characteristics of a field-effect transistor for data writing It should be noted that the above descriptions of the semiconductor device and the method of producing the semiconductor device are provided for explaining an exemplary embodiment according to the present disclosure, and the semiconductor device according to the present disclosure and the method of producing the same according to the present disclosure are not limited to the above descriptions.

Figure 13:
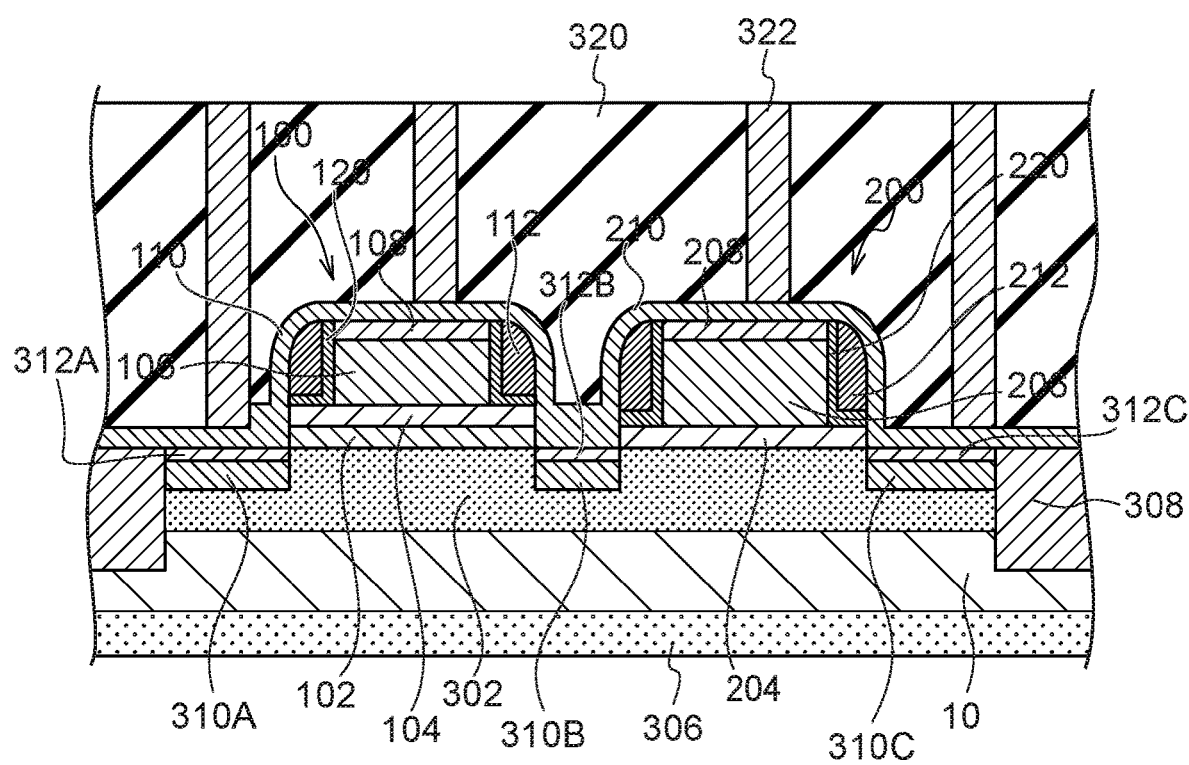

For example, the structure of a nonvolatile memory according to the present disclosure is not limited to the structures illustrated in FIG. 1, FIG. 2, and FIG. 13, and the present disclosure may be applied to any semiconductor device that includes a nonvolatile memory cell having a field-effect transistor for data writing and a field-effect transistor for data readout.

Although a case in which the thickness of the gate insulating film of the field-effect transistor for data writing is larger than the thickness of the gate insulating film of the field-effect transistor for data readout has been described in the aforementioned exemplary embodiment, the thickness of the gate insulating film of the field-effect transistor for data readout may be made larger than the thickness of the gate insulating film of the field-effect transistor for data writing, for example when application of a high voltage to the field-effect transistor for data readout is required. In other words, the thicknesses of the gate insulating films may be set in accordance with the characteristics (particularly threshold voltage) required for the respective field-effect transistors.

Also, applications of the semiconductor device according to the present disclosure are not limited, and the semiconductor device according to the present disclosure can be applied, without particular restrictions, to any semiconductor device in which data rewriting is required.

What is claimed is:

1. A semiconductor device, comprising:
   a semiconductor substrate, and
   a nonvolatile memory cell disposed on the semiconductor substrate, wherein:
   the nonvolatile memory cell comprises a field-effect transistor for data writing, and a field-effect transistor for data readout that is adjacent to the field-effect transistor for data writing,
   each of the field-effect transistor for data writing and the field-effect transistor for data readout includes a gate insulating film formed on the semiconductor substrate, a floating gate formed on the gate insulating film, and diffusion layers configuring a source region and a drain region on respective sides of the floating gate viewed in a thickness direction of the semiconductor substrate, and
   a thickness of the gate insulating film of the field-effect transistor for data readout, and a thickness of the gate insulating film of the field-effect transistor for data writing, are different.

2. The semiconductor device according to claim 1, wherein the thickness of the gate insulating film of the field-effect transistor for data readout is smaller than the thickness of the gate insulating film of the field-effect transistor for data writing.

3. The semiconductor device according to claim 1, wherein the gate insulating film comprises an oxide film or an oxynitride film.

4. The semiconductor device according to claim 1, wherein the thickness of the gate insulating film of the field-effect transistor for data writing is from 4 nm to 10 nm, and the thickness of the gate insulating film of the field-effect transistor for data readout is from 2 nm to 4 nm.

5. A method of producing a semiconductor device provided with a nonvolatile memory cell comprising a field-effect transistor for data writing and a field-effect transistor for data readout that is adjacent to the field-effect transistor for data writing, the method comprising:
   forming a first insulating film for configuring a part, in a thickness direction, of a gate insulating film of one of the field-effect transistor for data readout or the field-effect transistor for data writing, in a region of a semiconductor substrate in which the field-effect transistor for data writing and the field-effect transistor for data readout are to be formed;

removing a part of the first insulating film corresponding to a region in which the other one of the field-effect transistor for data readout or the field-effect transistor for data writing is to be formed;

forming a second insulating film configuring the gate insulating film together with the first insulating film in the one of the field-effect transistor for data readout or the field-effect transistor for data writing, and also configuring a gate insulating film in the other of the field-effect transistor for data readout or the field-effect transistor for data writing, in the region in which the field-effect transistor for data writing and the field-effect transistor for data readout are to be formed;

forming a floating gate on each of the gate insulating film for the field-effect transistor for data writing and the gate insulating film for the field-effect transistor for data readout; and forming diffusion layers configuring a source region and a drain region on respective sides of the floating gate of the field-effect transistor for data writing, and diffusion layers configuring a source region and a drain region on respective sides of the floating gate of the field-effect transistor for data readout, viewed in a thickness direction of the semiconductor substrate.

6. The method of producing a semiconductor device according to claim 5, wherein, in the removing the part of the first insulating film, the region from which the first insulating film is removed is a region in which the field-effect transistor for data readout is to be formed.

7. The method of producing a semiconductor device according to claim 5, wherein a thickness of the first insulating film formed in the forming the first insulating film is larger than a thickness of the second insulating film formed in the forming the second insulating film.

8. The method of producing a semiconductor device according to claim 5, wherein each of the first insulating film and the second insulating film is an oxide film or an oxynitride film.

* * * * *